United States Patent [19]

Nandakumar

[11] Patent Number: 5,610,857
[45] Date of Patent: Mar. 11, 1997

[54] MEMORY ELEMENT WITH MULTIBIT STORAGE

[75] Inventor: Vallath Nandakumar, Beaverton, Oreg.

[73] Assignee: Tektronix, Inc., Wilsonville, Oreg.

[21] Appl. No.: 621,857

[22] Filed: Mar. 25, 1996

[51] Int. Cl.[6] .................................................. G11C 11/44
[52] U.S. Cl. ........................... 365/162; 257/31; 257/36; 505/832
[58] Field of Search ..................................... 365/160, 162; 257/31, 36; 505/832, 874, 702; 326/3–5

[56] References Cited

U.S. PATENT DOCUMENTS

| | | | |
|---|---|---|---|
| 3,978,351 | 8/1976 | Zappe | 257/36 |
| 4,509,146 | 4/1985 | Wang | 365/162 |
| 5,260,264 | 11/1993 | Kurosawa | 365/162 |

OTHER PUBLICATIONS

Jutzi, I.B.M. Technical Disclosure Bulletine, vol. 17, No. 3, Aug. 1974.
"Experimental Investigation of the Threshold Curves of a Four–Junction SQUID" by V. Nandakumar & Y. K. Kwong, Physica B 194–196 (1994) 111–112.
"DC Analysis of Parallel Arrays of Two and Three Josephson Junctions" by Won–Tien Tsang and T. Van Duzer, Journal of Applied Physics, vol. 46, No. 10, Oct. 1975.
"Memory–Cell Design in Josephson Technology" by Hans H. Zappe, IEEE Transactions on Electron Devices, vol. ED–27, No. 10, Oct. 1980.
"Single Flux–Quantum Josephson Memory Cell Using a New Threshold Characteristic" by Itaru Kurosawa, Akihiko Yagi, Hiroshi Nakagawa and Hisao Hayakawa.
"A 4K Josephson Memory" by H. Suzuki, N. Fujimaki, H. Tamura, T. Imamura, and S. Hasuo, IEEE Transactions on Magnetics, vol. 25, No. 2, Mar. 1989.

*Primary Examiner*—David C. Nelms
*Assistant Examiner*—Son Mai
*Attorney, Agent, or Firm*—Francis I. Gray

[57] ABSTRACT

A memory element for multiple bit storage uses a plurality of Josephson junction devices coupled in parallel between a ground plane and a superconductive line. A gate current is directly coupled to the superconductive line at a midpoint, and a control current is magnetically coupled to the superconductive line along its length. The current trajectory of the gate and control currents from an initial value to a quiescent point in the threshold curve traces determines the states of the modes. All the modes have a stable operating point at the quiescent point. The control current in the absence of the gate current is used to maintain the memory element at the quiescent point, and the gate current is used to momentarily transition none, one or more of the Josephson junction devices to a voltage state to determine the states of the modes at the quiescent point via appropriate Josephson sensors.

2 Claims, 3 Drawing Sheets

# MEMORY ELEMENT WITH MULTIBIT STORAGE

BACKGROUND OF THE INVENTION

The present invention relates to memory elements in Josephson technology, and more particularly to a memory element with multibit storage capability using Josephson junction devices.

Memory devices for superconductive circuits traditionally have large storage elements for non-destructive readout (NDRO) capabilities, even larger than comparable semiconductor memory elements. These superconductive memory devices use flux storage in loops, which is not fast relatively speaking, the access time being on the order of hundreds of picoseconds. For economical production large scale integration is required, but the yield for superconductive memory elements is not sufficient to produce memories above 4 kilobits. Finally superconductive memory elements are susceptible to flux trapping, i.e., they are sensitive to magnetic fields that are either ambient or self-induced. Shielding of the elements is very difficult, and to detrap the flux the surface needs to be warmed up, which is destructive to the memory contents.

What is desired is a high speed, low area memory element with multiple bit storage.

SUMMARY OF THE INVENTION

Accordingly the present invention provides a memory element with multiple bit storage using a four-junction superconducting quantum interference device (SQUID). Four Josephson junction devices are coupled in parallel, having one end coupled to a ground plane and the other end coupled via a superconductive line to each other. A gate current is directly coupled to the junction between the middle two Josephson junction devices, and a control current is magnetically coupled to the superconductive line. Each of the SQUID modes is a connected region of stable operating points for the zero voltage state which regions overlap to encompass a common quiescent point for all four modes. The status of the four modes in the overlap may be represented by two data bits so that the four-junction SQUID provides a two-bit memory element. The status of the four modes is determined by the gate and control currents, with the control current maintaining the quiescent point between read/write cycles. The gate current is used to read the contents of the memory by causing one or more of the Josephson junction devices to switch momentarily to the voltage state, which transition is detected by sending the voltage across the junctions capacitively to Josephson switches acting as sensors. The Josephson switches are biased so that the voltage from the junctions which switch cause the Josephson switches to go into the voltage state. The voltage reading for the Josephson switches inidicates the state of the modes, and thus the two-bit information stored in the four-junction SQUID.

The objects, advantages and other novel features of the present invention are apparent from the following detailed description when read in conjunction with the appended claims and attached drawing.

DESCRIPTION OF THE PREFERRED EMBODIMENT

Figure 1:
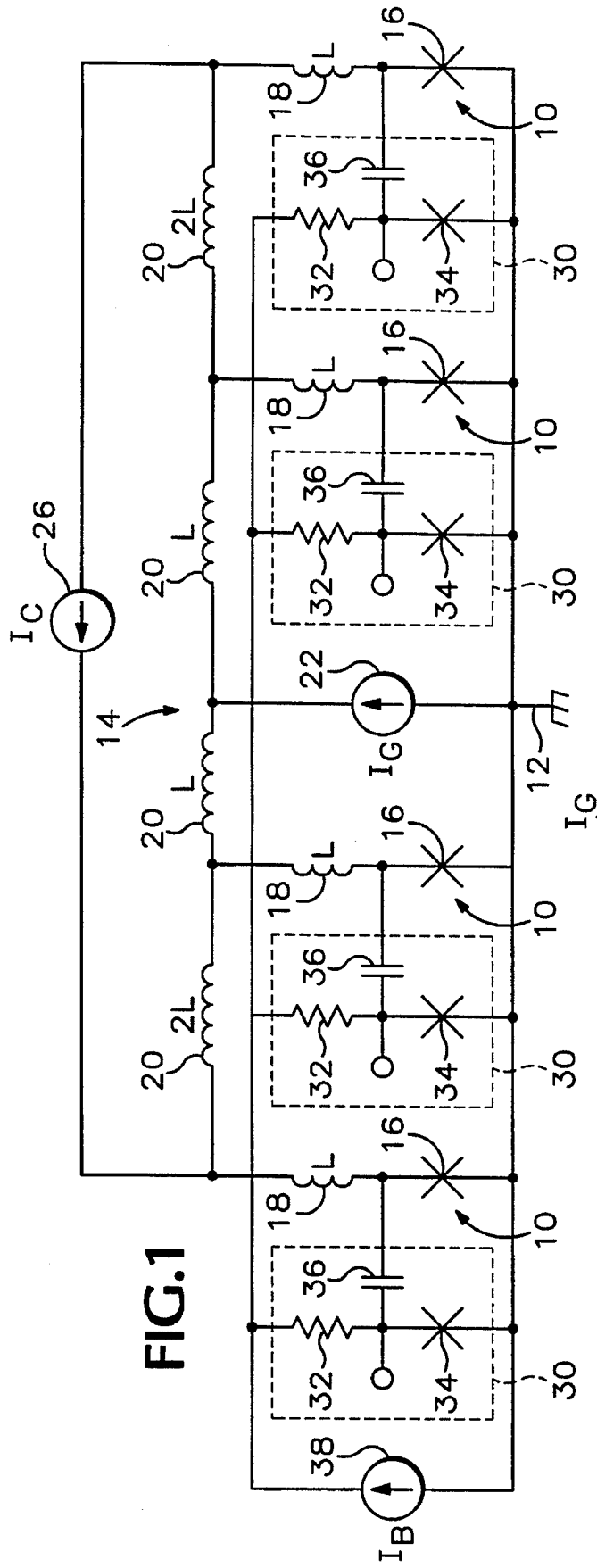
FIG. 1 is an equivalent circuit schematic diagram for a memory element with multiple bit storage according to the present invention.

Referring now to FIG. 1 a four-junction superconducting quantum interference device (SQUID) configured as a multibit memory element is shown in equivalent schematic circuit form. Four Josephson junction devices 10 are coupled in parallel, with one end coupled to a ground plane 12 and the other end coupled to a superconductive line 14. Each Josephson junction device 10 is represented by an ideal switch 16 and an inductor 18 in series. The superconductive line 14 is represented by a series of inductors 20. A variable gate current $I_g$ from a suitable source 22 is directly coupled to a midpoint 24 of the superconductive line 14, which divides the representative inductor between the middle Josephson junction devices 10 in one-half. A variable control current $I_c$ from a suitable source 26 is magnetically coupled to the superconductive line 14.

A sensor 30 is coupled in parallel with each Josephson junction device 10. Each sensor 30 is represented by a resistor 32 in series with a Josephson junction switch 34 and a capacitor 36 coupled to the junction between the resistor and the Josephson junction switch. Each sensor is coupled between a switchable bias current source 38 and ground, with the capacitor 36 coupling the sensor to the corresponding Josephson junction device 10.

Figure 2:
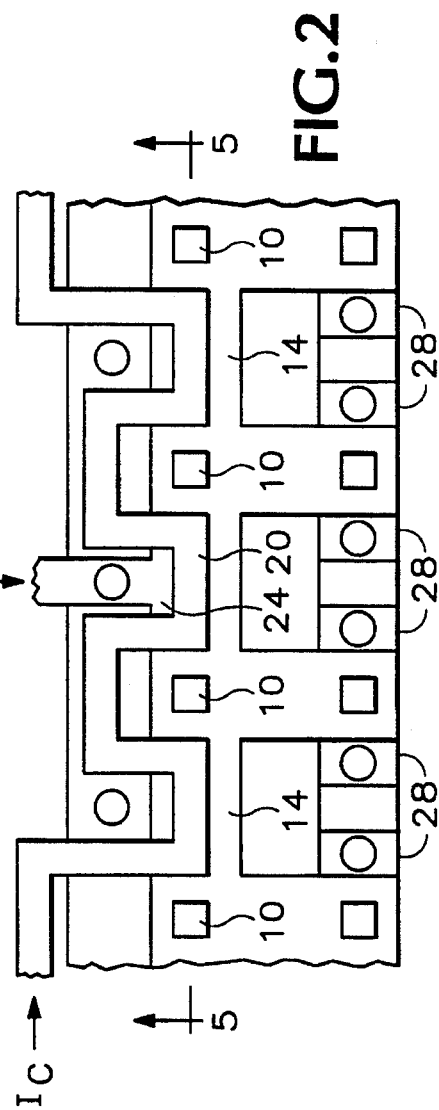
FIG. 2 is a planar view of a memory element with multiple bit storage according to the present invention.
Figure 5:
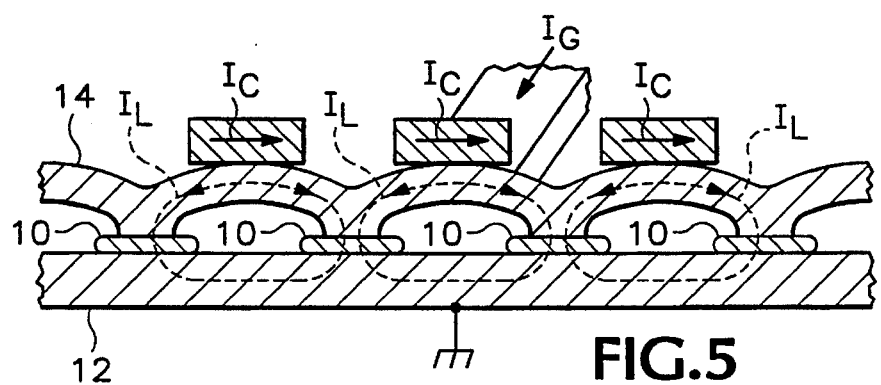
FIG. 5 is a cross-sectional view of the memory element of FIG. 2 taken along the line 5—5.

FIG. 2 shows a top plan view of the four-junction SQUID without the sensors. Parallel resistors 28 are added for damping to assure that the SQUID does not switch at any point between two modes, but only when the global maximum of critical current is reached. FIG. 5 shows a cross-sectional view of the four-junction SQUID illustrating the current loops through each Josephson junction device 10. In operation as the control and/or gate currents are varied, a point is reached where the loop current becomes too large for the Josephson junction device. The junction device then momentarily switches to the voltage state and reverses the direction of the loop current. The directions of the loop currents are an indication of the state of the modes, i.e., the stored bit information. If the gate current exceeds a critical current that is a function of the control current, the Josephson junction device switches to a permanent voltage state.

Figure 3:
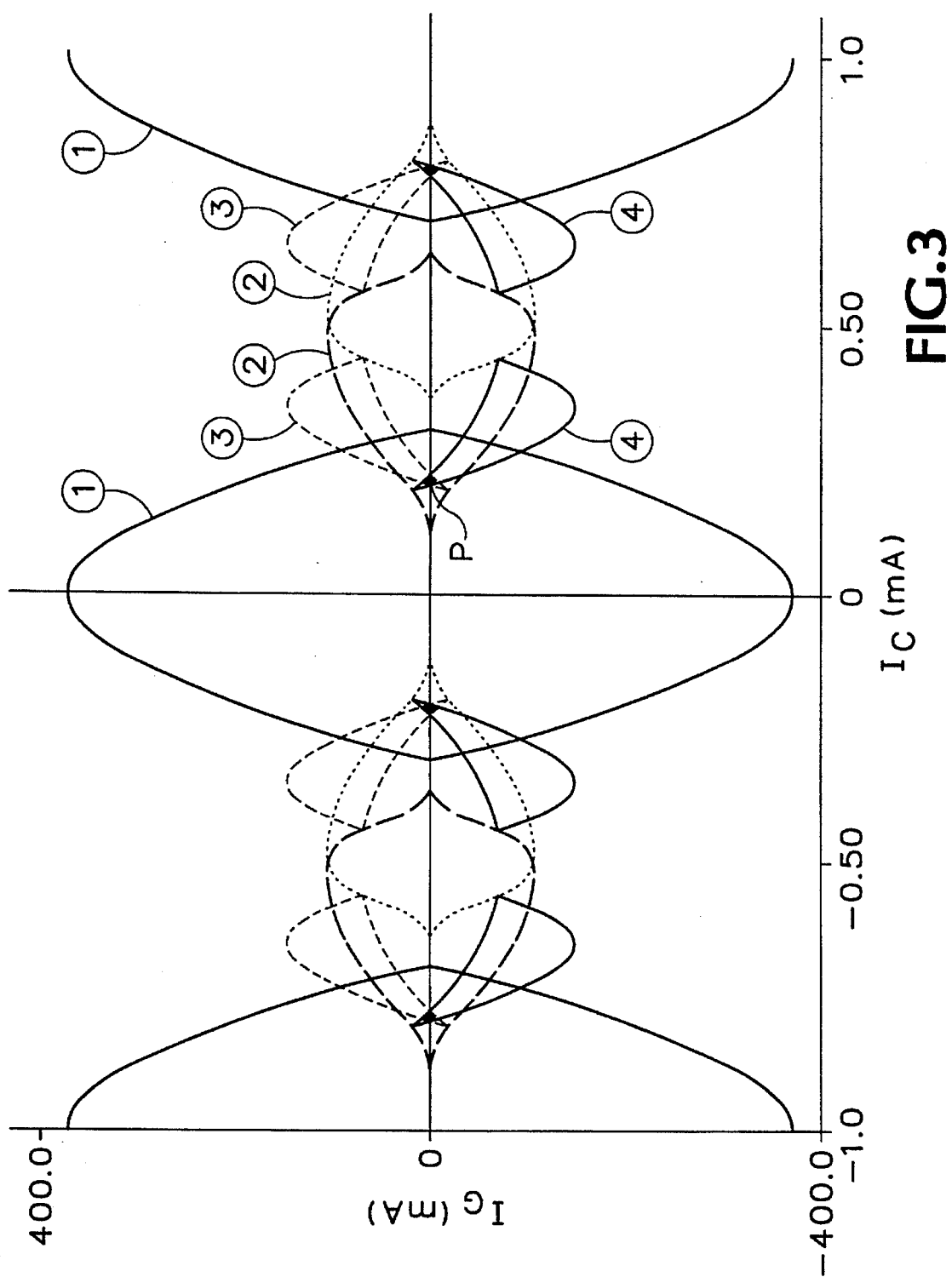
FIG. 3 is a threshold curve graph for a memory element with multiple bit storage according to the present invention.

The threshold curves for the four-junction SQUID are shown in FIG. 3. Each of the curves (1)–(4) represent one of the four modes of the SQUID. The regions within the respective envelopes represent stable operating points for that particular mode. These curves show the mode boundaries in current space where a transition to another mode or to an unstable region takes place abruptly, with a momentary or permanent switching of at least one of the Josephson junctions 10 to a voltage state. The values of the maximum gate current $I_g$ for which the SQUID remains in the zero voltage state are the global boundaries which represent the critical current of the SQUID. The critical current depends upon the control current $I_c$, as is clear from the graph. A quiescent point P is shown where all four of the modes have stable operating points. To stay at the quiescent point P the control current $I_c$ in the absence of the gate current $I_g$ is maintained at about 250 ua for this example.

Figure 4:
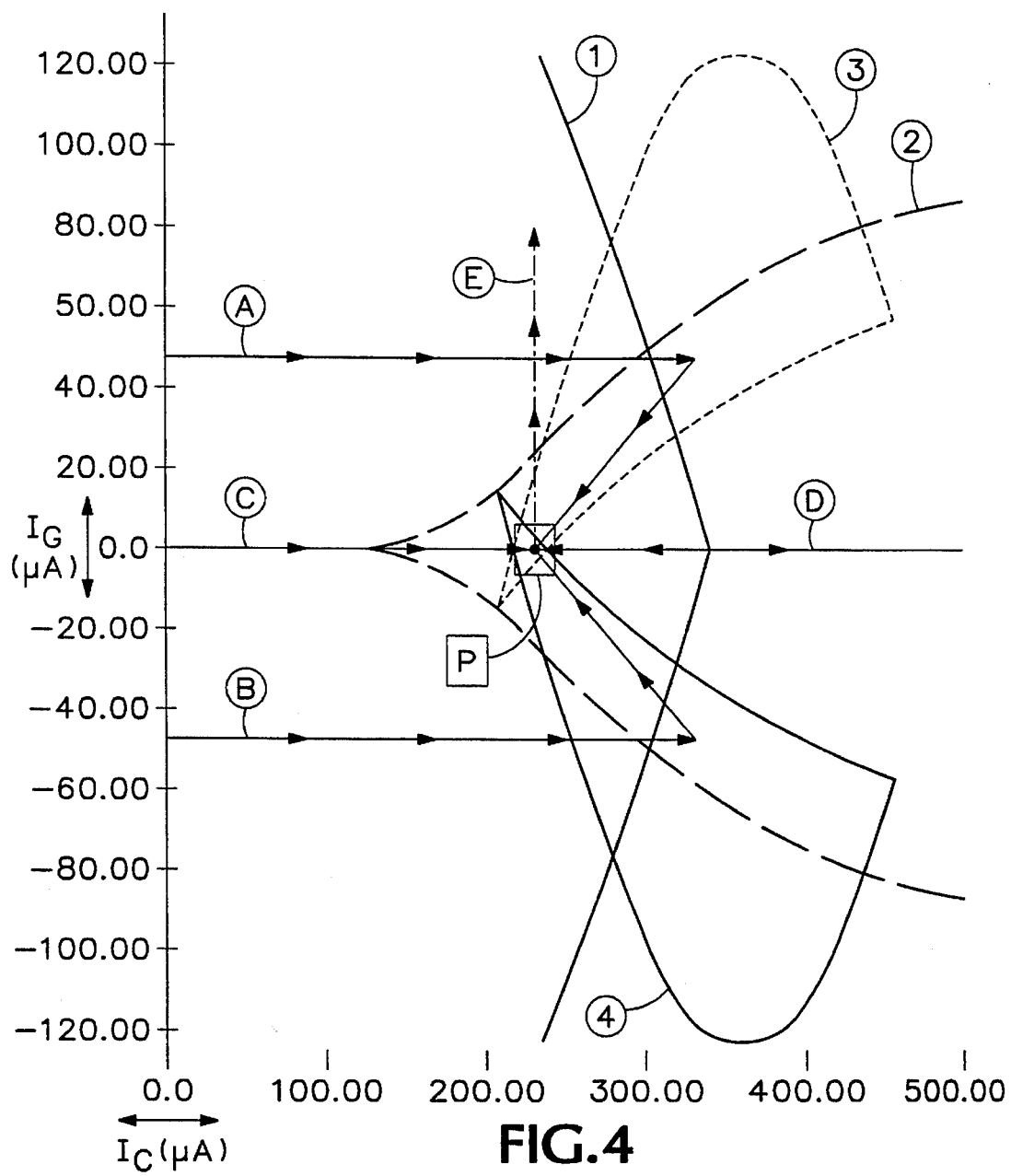
FIG. 4 is an expanded view of the threshold curve graph of FIG. 3.

The write process is shown as being along any one of four trajectories (A)–(D) in FIG. 4 for the SQUID memory element. Trajectory (A) applies a gate current $I_g$ of approximately 50 ua and then raises the control current $I_c$ to over 300 ua, i.e., outside mode (1) but inside modes (2) and (3). Then the two currents are decreased linearly to the quiescent point P, establishing mode (3). For trajectory (B) a negative gate current is applied, but otherwise the trajectory is the mirror image of trajectory (A) with modes (2) and (4) being the turn junction to establish mode (4). Trajectory (C) is controlled by the control current only by raising the control current to the quiescent point P, establishing mode (1). The fourth trajectory (D) extends trajectory (C) to a point outside all of the modes except mode (2) before returning to the quiescent point P, establishing mode (2). So long as the control current stays at the quiescent point P with no applied gate current, the loop currents $I_L$ in the SQUID, representing stable operating points for the four modes, remain constant.

To read the data from the SQUID memory element the gate current $I_g$ is raised along the trajectory (E) to 80 ua, for example. For each different mode different ones, or none, of the four Josephson junction devices 10 switch momentarily to the voltage state. This transition is detected by sensing the voltage across each of the junctions 10 capacitively by the sensors 30. A bias current $I_B$ is applied to the sensors 30, and then the gate current $I_g$, as it moves up along trajectory (E) moves from the quiescent point P where there are stable operating points for all four modes to a point where there is a stable operating point only in one mode, mode (1) as illustrated. According to the direction of the loop currents one or more of the Josephson junction devices 10 momentarily switches, reversing the loop current, and that momentary transition to the voltage state is transferred by the capacitor 36 to the sensor 30 where the Josephson junction switch 34 switches to the voltage state. The respective states of the four sensors 30 is an indication of the state of the modes of the four-junction SQUID device. This is a destructive readout, so that after the states of the sensors are determined, the bias current is removed and the information is written back into the four-junction SQUID device as described above to reestablish the readout mode. Thus a small compact SQUID with 5 um×5 um Josephson junctions stores the equivalent of two bits since there are four stable modes corresponding to the quiescent point P. Other multi-junction structures with additional overlapping mode boundaries may provide even more efficient memory elements.

Therefore the present invention provides a memory element with multiple bit storage using a compact multi-Josephson junction SQUID array that has a plurality of modes that overlap at a quiescent point. With a control current and a gate current information may be "written" into the memory element by establishing the state for the modes for the SQUID array, and may be "read out" by applying a read gate current that causes none, one or more of the junctions to transition momentarily to the voltage state, the junction(s) that transitions being determinative of the state of the modes of the SQUID array, i.e., the corresponding "bit" values for the memory element.

What is claimed is:

1. A memory element for multiple bit storage comprising:

a plurality of Josephson junction devices coupled in parallel between a ground plane and a superconducting line to form a SQUID device, the SQUID device having at least four stable operating modes with a common quiescent point for all the stable operating modes;

a plurality of Josephson sensors capacitively coupled one to each of the plurality of Josephson junction devices and coupled between a source of switchable bias current and the ground plane; and means for receiving a variable control current and a variable gate current to control the Josephson junction devices in order to write into the memory element by selecting the states for the stable operating modes for the SQUID device and to read the state of the stable operating modes by switching of the Josephson junction devices in response to a read gate current, the switching being sensed by the Josephson sensors.

2. The memory element as recited in claim 1 wherein the receiving means comprises:

a gate current lead coupled to the superconductive line for directly coupling the gate current to the SQUID device; and a control current lead magnetically coupled to the superconductive line for coupling the control current to the SQUID device, the trajectory of the gate and control currents to the quiescent point from initial values establishing the mode states.

* * * * *